US010145923B2

United States Patent
Jo et al.

(10) Patent No.: US 10,145,923 B2
(45) Date of Patent: Dec. 4, 2018

(54) RESONANCE IMAGING APPARATUS AND DIFFUSION WEIGHTED IMAGE ACQUIRING METHOD THEREOF

(71) Applicants:Samsung Electronics Co., Ltd., Gyeonggi-do (KR); Korea Advanced Institute of Science and Technology, Daejeon (KR)

(72) Inventors: Jae Moon Jo, Gyeonggi-do (KR); Hyun Wook Park, Daejeon (KR); Hyeon Seok Seo, Daejeon (KR)

(73) Assignees: Samsung Electronics Co., Ltd., Yeongtong-gu, Suwon-si, Gyeonggi-do (KR); Korea Advanced Institute of Science and Technology, Guseong-dong, Yuseong-gu, Daejeon (KR)

( * ) Notice: Subject to any disclaimer, the term of this patent is extended or adjusted under 35 U.S.C. 154(b) by 1582 days.

(21) Appl. No.: 13/898,603

(22) Filed: May 21, 2013

(65) Prior Publication Data

US 2013/0335080 A1 Dec. 19, 2013

(30) Foreign Application Priority Data

Jun. 19, 2012 (KR) .......................... 10-2012-0065839

(51) Int. Cl.
| | | |
|---|---|---|
| *G01R 33/561* | (2006.01) | |
| *G01R 33/48* | (2006.01) | |
| *G01R 33/563* | (2006.01) | |
| *G01R 33/565* | (2006.01) | |

(52) U.S. Cl.
CPC ....... *G01R 33/561* (2013.01); *G01R 33/4824* (2013.01); *G01R 33/56341* (2013.01); *G01R 33/56509* (2013.01)

(58) Field of Classification Search
USPC .......................... 324/300–322; 600/407–435
See application file for complete search history.

(56) References Cited

U.S. PATENT DOCUMENTS

| | | | | | |
|---|---|---|---|---|---|
| 5,833,609 | A * | 11/1998 | Dannels | ........... | G01R 33/56341 324/309 |
| 6,476,607 | B1 * | 11/2002 | Dannels | ............ | G01R 33/4824 324/307 |
| 9,360,539 | B2 * | 6/2016 | Carroll | ............... | G01R 33/4826 |
| 9,612,307 | B2 * | 4/2017 | Zhou | .................. | G01R 33/4824 |
| 9,983,283 | B2 * | 5/2018 | Dannels | ............ | G01R 33/4824 |

(Continued)

OTHER PUBLICATIONS

Chinese Search Report, dated Nov. 4, 2016.
(Continued)

*Primary Examiner* — Melissa Koval
*Assistant Examiner* — Tiffany Fetzner
(74) *Attorney, Agent, or Firm* — Cha & Reiter, LLC.

(57) ABSTRACT

A magnetic resonance imaging apparatus and a diffusion-weighted image acquiring method form a radial k-space through a radial sampling and acquire a diffusion-weighted image from the radial k-space, with the diffusion-weighted image acquiring including receiving an echo signal generated from the subject, and forming a k-space having a plurality of sampling lines by sampling the echo signal that is received, wherein the directions of the diffusion gradient magnetic fields applied at the time of forming the sampling lines that compose the k-space to cross each other at two adjacent sampling lines.

10 Claims, 15 Drawing Sheets

(56) References Cited

U.S. PATENT DOCUMENTS

| | | | | |
|---|---|---|---|---|
| 2009/0021254 A1* | 1/2009 | Gore | ............... | G01R 33/4824 324/309 |
| 2013/0335080 A1* | 12/2013 | Jo | ............... | G01R 33/561 324/309 |
| 2014/0062477 A1* | 3/2014 | Carroll | ............... | G01R 33/4826 324/309 |
| 2014/0111203 A1* | 4/2014 | Zhou | ............... | G01R 33/4824 324/309 |
| 2016/0274209 A1* | 9/2016 | Dannels | ............... | G01R 33/4824 |

OTHER PUBLICATIONS

Butts et al, "Isotropic Diffusion-Weighted and Spiral-Navigated Interleaved EPI for Routine Imaging of Acute Stroke", May 15, 1997, pp. 741-749, Williams & Wilkins.

Trouard et al, "High-Resolution Diffusion Imaging With DIFRAD-FSE (Diffusion-Weighted Radial Acquisition of Data With Fast Spin-Echo) MRI", Magnetic Resonance in Medicine, Apr. 20, 1999, pp. 11-18, Wiley-Liss Inc.

Sarlls et al, "Isotropic Diffusion Weighting in Radial Fast Spin-Echo Magnetic Resonance Imaging", Magnetic Resonance in Medicine, Dec. 29, 2004, pp. 1347-1354, Wiley-Liss Inc.

Sarlls et al, "Diffusion-Weighted Radial Fast Spin-Echo for High-Resolution Diffusion Tensor Imaging at 3T", Magnetic Resonance in Medicine, Mar. 3, 2008, pp. 270-276, Wiley-Liss Inc.

Frank et al, "High efficiency, low distortion 3D diffusion tensor imaging with variable density spiral fast spin echoes (3D DW VDS RARE)", NeuroImage, Sep. 11, 2009, pp. 1510-1523, Elsevier Inc.

Chinese Search Report, dated Jul. 12, 2017.

Chinese Search Report; dated Jan. 19, 2018.

Chinese Search Report dated Jul. 31, 2018.

* cited by examiner

RESONANCE IMAGING APPARATUS AND DIFFUSION WEIGHTED IMAGE ACQUIRING METHOD THEREOF

CLAIM OF PRIORITY

This application claims, pursuant to 35 USC 119(a), priority to and the benefit of the earlier filing date of Korean Patent Application No. 2012-065839, filed on Jun. 19, 2012, in the Korean Intellectual Property Office, the entire disclosure of which is incorporated herein by reference.

BACKGROUND OF THE INVENTION

1. Field of the Invention

The present disclosure relates to magnetic resonance imaging, and in particular to a magnetic resonance imaging apparatus being used for a diagnosis of various diseases by using a magnetic resonance image, and a diffusion-weighted image acquiring method thereof.

2. Description of the Related Art

In general, a medical imaging apparatus is an apparatus configured to provide an image by acquiring information of a patient. The medical imaging apparatus may include an x-ray apparatus, an ultrasonic wave diagnostic apparatus, a computerized tomography apparatus, and a magnetic resonance imaging (MRI) apparatus.

From the above medical imaging apparatuses, the magnetic resonance imaging apparatus has a relative flexibility of the image photographing conditions, and provides various images with diagnostic information and superior contrast of soft tissue, thereby taking an important position in the diagnostic field using a medical image.

Magnetic Resonance Imaging (MRI) refers to acquiring an image of the density and the physicochemical characteristics of body tissues based on the characteristics of an atomic nucleus by generating a nuclear magnetic resonance phenomenon at a hydrogen atomic nucleus, or other atomic nuclei not limited to hydrogen, of the body by use of a magnetic field, which is not harmful to a human body, and a radio frequency (RF) signal, which is a specific ionization radiation.

In more detail, the magnetic resonance imaging apparatus is an image diagnostic apparatus configured to diagnose the inside of a human body by converting the energy emitted from an atomic nucleus into a signal after supplying a constant frequency and energy to the atomic nucleus in a state of the atomic nucleus applied with a constant magnetic field.

Since a proton included in an atomic nucleus is provided with spin angular momentum and a magnetic dipole, when a magnetic field is applied, the proton is aligned in a direction of the magnetic field, and the atomic nucleus performs a precession around the direction of the magnetic field. By using the precession, an image of a human body may be acquired through a nuclear magnetic resonance phenomenon.

Meanwhile, in the field of a magnetic resonance imaging, a diffusion-weighted image is being used in the prior art in order to acquire various shapes of tissues using imaging contrasts, and the diffusion-weighted image refers to an image having a difference of the contrasts weighted according to the degree and the direction of diffusion of the molecules generated inside the tissue of a human body by applying diffusion gradient magnetic fields in several directions.

In the prior art, as the need for a diffusion-weighted image has increased, the development of a technology capable of reducing the time needed to acquire an image while minimizing a motion artifact is in demand.

SUMMARY OF THE INVENTION

Therefore, it is an aspect of the present invention to provide a magnetic resonance imaging apparatus configured to form a radial k-space through a radial sampling to acquire a diffusion-weighted image from the radial k-space, and a diffusion-weighted image acquiring method thereof.

Additional aspects of the present invention will be set forth in part in the description which follows and, in part, will be obvious from the description, or may be learned by practice of the present invention.

In accordance with one aspect of the present invention, a method of acquiring a diffusion-weighted image of a magnetic resonance imaging apparatus by applying a diffusion gradient magnetic field to a subject is performed as follows. An echo signal generated from the subject may be received. A k-space having a plurality of sampling lines may be formed by sampling the echo signal that is received. Diffusion gradient magnetic fields, which are applied at the time of forming of the sampling lines that compose the k-space, may have different directions thereof from one another.

The forming of the k-space having the plurality of sampling lines by sampling the received echo signal may include forming a radial k-space having a plurality of radial sampling lines by radial-sampling the received echo signal.

The applying of the diffusion gradient magnetic fields at the time of forming the sampling lines that compose the k-space at different directions from one another may include allowing directions of the diffusion gradient magnetic fields applied at the time of forming the sampling lines that compose the k-space to cross each other at two adjacent sampling lines.

The applying of the diffusion gradient magnetic fields at the time of forming the sampling lines that compose the k-space at different directions from each other may include allowing directions of the diffusion gradient magnetic fields applied at the time of forming the sampling lines to be orthogonal to each other at two adjacent sampling lines.

The diffusion gradient magnetic fields applied at the time of forming the sampling lines that compose the k-space may be applied to have a difference of angles thereof by about 90 degrees at an even-numbered sampling line and at an odd-numbered sampling line.

An angle of a diffusion gradient magnetic field applied at the time of forming the even-numbered sampling line may be about zero degrees, and an angle of a diffusion gradient magnetic field applied at the time of forming the odd-numbered sampling line may be about 90 degrees.

The diffusion gradient magnetic fields applied at the time of forming the sampling lines that compose the k-space may be applied in a way that an angle of a diffusion gradient magnetic field at an odd-numbered sampling line is greater by about 90 degrees than an angle of a diffusion gradient magnetic field at an immediately preceding even-numbered sample line.

An angle of a diffusion gradient magnetic field applied at the time of forming an even-numbered sampling line may be increased in comparison to an angle of a diffusion gradient magnetic field applied at the time of forming a preceding even-number sampling line.

The method may be achieved by further performing the following. A diffusion-weighted image may be reconstructed from data of the k-space by using a Filtered Back Projection (FBP) method when the k-space is formed.

In accordance with another aspect of the present invention, a magnetic resonance imaging apparatus includes a static magnetic field coil unit, a gradient coil unit, a RF coil reception unit, an image processing unit, and a control unit. The static magnetic field coil unit may be configured to apply a static magnetic field to a subject. The gradient coil unit may form diffusion gradient magnetic fields at the static magnetic field. The RF coil reception unit may be configured to apply a RF pulse to the subject, and to receive an echo signal generated from the subject. The image processing unit may form a k-space having a plurality of sampling lines by sampling the echo signal of the subject received from the RF coil reception unit. The control unit may be configured to control the gradient coil unit so that directions of the diffusion gradient magnetic fields, which are applied at the time of forming each sampling line that composes the k-space, are different from each other.

The image processing unit may form a radial k-space having a plurality of radial sampling lines by radial-sampling the echo signal of the subject that is received from the RF coil unit.

The control unit may control the gradient coil unit, so that the directions of the diffusion gradient magnetic fields, which are being applied at the time of forming the sampling lines that compose the k-space, cross each other at two adjacent sampling lines.

The control unit may control the gradient coil unit, so that the directions of the diffusion gradient magnetic fields, which are being applied at the time of forming the sampling lines that compose the k-space, are orthogonal to each other at two adjacent sampling lines.

The control unit may control the gradient coil unit, so that the diffusion gradient magnetic fields, which are being applied at the time of forming the sampling lines that form the k-space, have a difference of angles thereof at an even-numbered sampling line and at an odd-numbered sampling line by about 90 degrees.

The control unit may control the gradient coil unit, so that an angle of a diffusion gradient magnetic field, which is being applied at the time of forming an even-numbered sampling line, is about zero degrees, and that an angle of a diffusion gradient magnetic field, which is being applied at the time of forming an odd-numbered sampling line, is about 90 degrees.

The control unit may control the gradient coil unit, so that an angle of a diffusion gradient magnetic field, which is being applied at the time of forming an odd-numbered sampling line, among the diffusion gradient magnetic fields applied at the time of forming the sampling lines that compose the k-space is increased by about 90 degrees in comparison to an angle of a diffusion gradient magnetic field at an immediately preceding even-numbered sampling line.

The control unit may control the gradient coil unit, so that an angle of a diffusion gradient magnetic field, which is being applied at the time of forming an even-numbered sampling line, is increased in comparison to an angle of a diffusion gradient magnetic field, which is being applied at the time of forming an immediately preceding even-numbered sampling line.

The image processing unit, when the k-space is formed, may reconstruct a diffusion-weighted image from data at the k-space by using a Filtered Back Projection (FBP) method.

In accordance with another aspect of the present invention, a method of acquiring a diffusion weighted image of a magnetic resonance imaging apparatus by applying a diffusion gradient magnetic field to a subject is performed as follows. An echo signal generated from the subject may be received. A k-space having a plurality of sampling lines may be formed by sampling the received echo signal. Angles of diffusion gradient magnetic fields being applied at the time of forming of the sampling lines that compose the k-space may be different from each other at each of the sampling lines.

An angle of a diffusion gradient magnetic field, which is being applied at the time of forming each sampling line that composes the radial k-space, may be the same as an angle of the each of the sampling lines.

In accordance with another aspect of the present invention, a magnetic resonance imaging apparatus includes a static magnetic field coil unit, a gradient coil unit, a RF coil unit, an image processing unit, and a control unit. The static magnetic field coil unit may be configured to apply a static magnetic field to a subject. The gradient coil unit may form diffusion gradient magnetic fields at the static magnetic field. The RF coil unit may be configured to apply a RF pulse to the subject, and to receive an echo signal generated from the subject. The image processing unit may be configured to form a k-space having a plurality of sampling lines by sampling the echo signal of the subject received from the RF coil unit. The control unit may be configured to control the gradient coil unit so that directions of the diffusion gradient magnetic fields, which are being applied at the time of forming each sampling line that composes the k-space, are different from each other at each of the sampling lines.

The control unit may control the gradient coil unit, so that an angle of a diffusion gradient magnetic field, which is being applied at the time of forming each sampling line that composes the radial k-space, is the same as an angle of the each of the sampling lines.

According to a magnetic resonance imaging apparatus and a diffusion-weighted imaging acquiring method in accordance with one aspect of the present invention, the time for acquiring an image may be reduced, and the degree of diffusion may be precisely measured.

In addition, an Apparent Diffusion Coefficient (ADC) map may be calculated in a faster and precise manner.

BRIEF DESCRIPTION OF THE DRAWINGS

These and/or other aspects of the present invention will become apparent and more readily appreciated from the following description of the exemplary embodiments, taken in conjunction with the accompanying drawings of which.

DETAILED DESCRIPTION OF THE INVENTION

Figure 1:
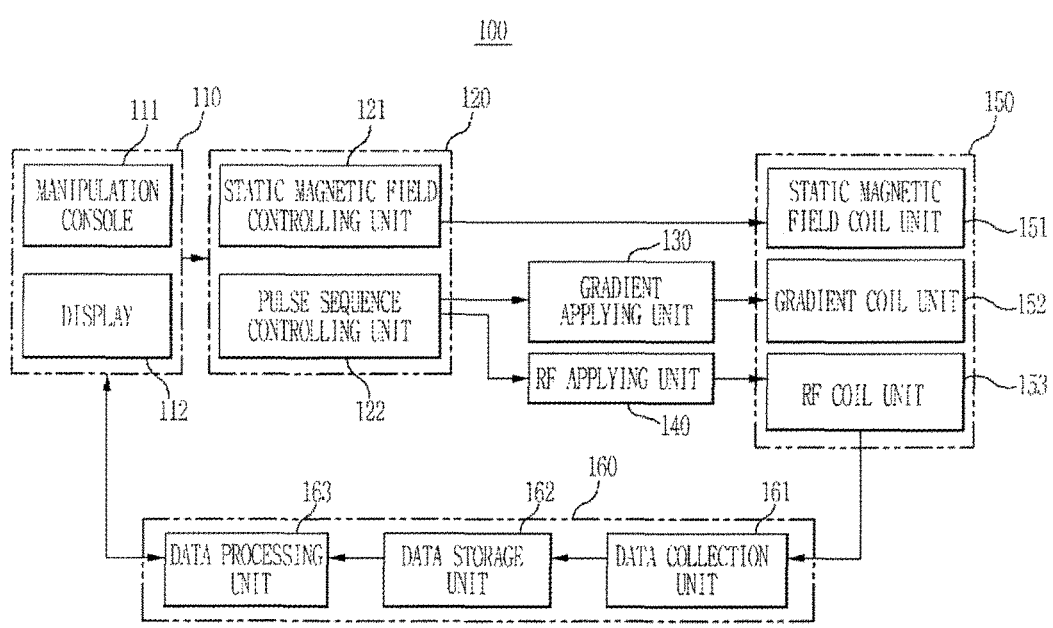
FIG. 1 is a block diagram of a magnetic resonance imaging apparatus in accordance with one exemplary embodiment of the present invention.

Reference will now be made in detail to the exemplary embodiments of the present invention, examples of which are illustrated in the accompanying drawings, wherein like reference numerals refer to like elements throughout. In the following description, a detailed explanation of known related functions and constructions may be omitted to avoid unnecessarily obscuring the subject matter of the present invention. The present invention may, however, be embodied in many different forms and should not be construed as limited to the exemplary embodiments set forth herein. In addition, terms described herein, which are defined with reference to the functions of the present invention, may be implemented differently depending on a user or operator's intention and practice. Therefore, the terms should be understood on the basis of the disclosure throughout the specification. The principles and features of this invention may be employed in varied and numerous exemplary embodiments without departing from the scope of the invention.

Furthermore, although the drawings represent exemplary embodiments of the invention, the drawings are not necessarily to scale and certain features may be exaggerated or omitted in order to more clearly illustrate and explain the present invention.

FIG. 1 is a block diagram of a magnetic resonance imaging apparatus 100 in accordance with one exemplary embodiment of the present invention.

Referring to FIG. 1, the magnetic resonance imaging apparatus 100 in accordance with the exemplary embodiment of the present invention includes a magnet assembly 150 to form a magnetic field and to generate a resonance phenomenon for an atomic nucleus, a control unit 120 to control the operation of the magnet assembly 150, and an image processing unit 160 to generate a magnetic resonance image by receiving an echo signal generated from the atomic nucleus.

The magnet assembly 150 includes a static magnetic field coil unit 151 to form a static magnetic field inside the magnet assembly 150, a gradient coil unit 152 to form a gradient magnetic field at the static magnetic field, and a RF coil unit 153 to excite the atomic nucleus by applying a radio frequency (RF) pulse and to receive an echo signal from the atomic nucleus.

The control unit 120 includes a static magnetic field controlling unit 121 to control the intensity and the direction of the static magnetic field that the static magnetic field coil unit 151 generates, and a pulse sequence controlling unit 122 to generate and output a pulse sequence and to control the gradient coil unit 152 and the RF coil unit 153 according to the pulse sequence.

In addition, the magnetic resonance imaging apparatus 100 in accordance with the exemplary embodiment of the present invention includes a gradient applying unit 130 to apply a gradient signal to the gradient coil unit 152, and an RF applying unit 140 to apply an RF signal to the RF coil unit 153, so that the gradient magnetic field formed at the static magnetic field and the RF signal applied to the atomic nucleus are adjusted as the pulse sequence controlling unit 122 controls the gradient applying unit 130 and the RF application unit 140.

In addition, the magnetic resonance imaging apparatus 100 in accordance with the exemplary embodiment of the present invention is provided with a user manipulation unit 110 to receive a control command with respect to an overall operation of a magnetic resonance imaging apparatus 100 from a user, and in particular, by receiving a command with respect to a scan sequence from the user for performing an MRI scan of the subject 200, a pulse sequence may be generated accordingly.

Figure 2:
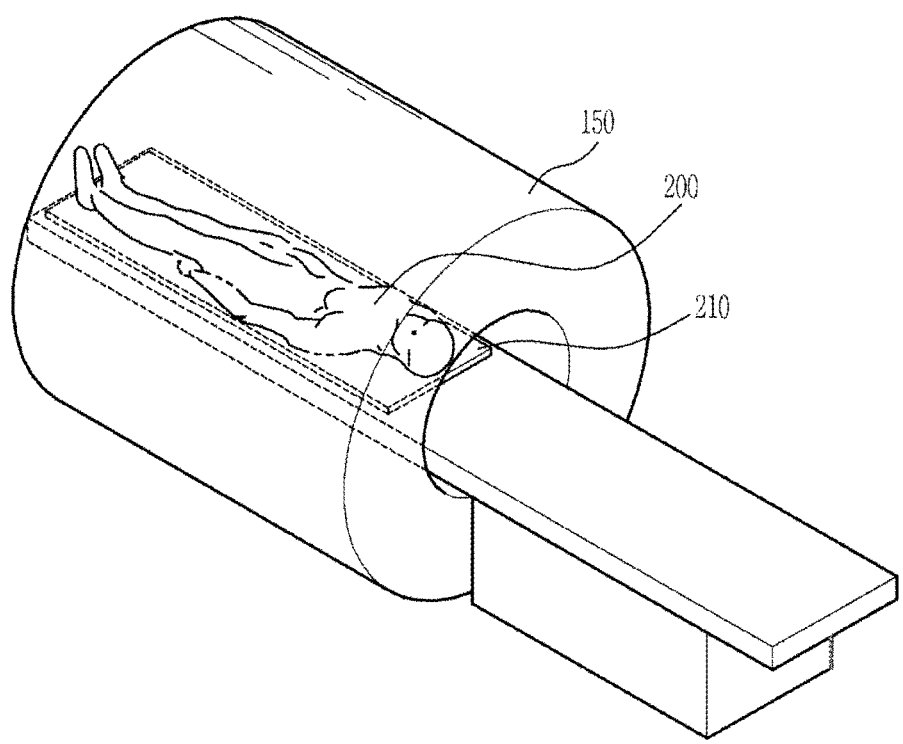
FIG. 2 is an exterior perspective view showing a magnetic resonance imaging apparatus in accordance with the exemplary embodiment of the present invention.

The user manipulation unit 110 may include a manipulation console 111 provided for an administrator, user, technician, or diagnostician to manipulate and control the magnetic resonance imaging apparatus 100, and a display 112 configured to display an image generated from the image processing unit 160 so that the user may diagnose the health condition of a subject 200, shown in FIG. 2, using the magnetic resonance imaging apparatus 100 of FIG. 1.

Figure 3:
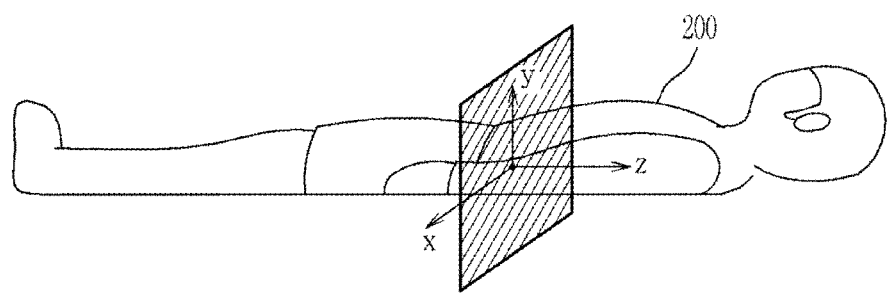
FIG. 3 is a drawing illustrating a space in which a subject is placed, which has an x-axis, a y-axis, and a z-axis.
Figure 4:
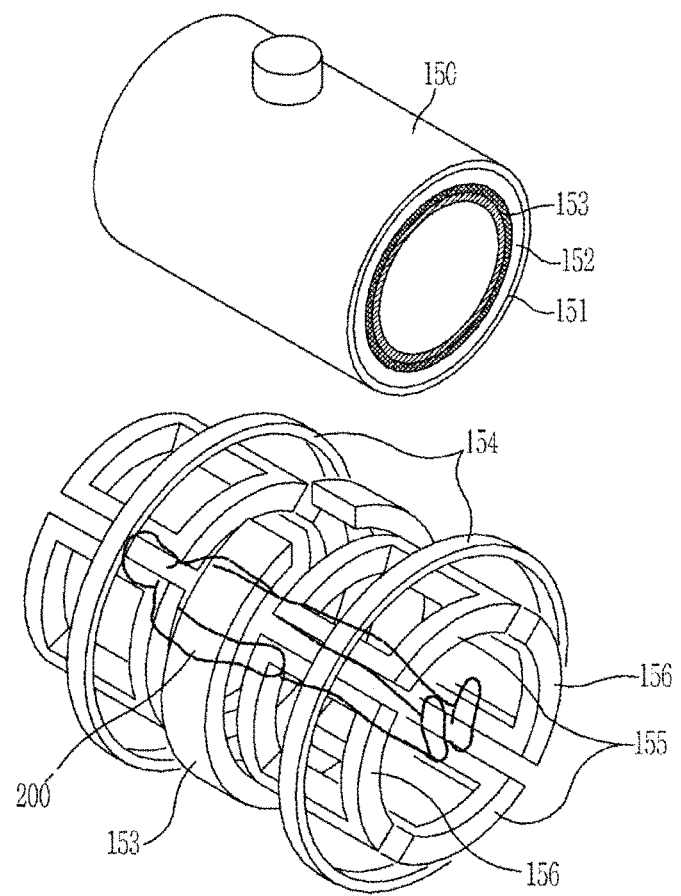
FIG. 4 is a drawing illustrating a gradient coil unit in accordance with the exemplary embodiment of the present invention.
Figure 5:
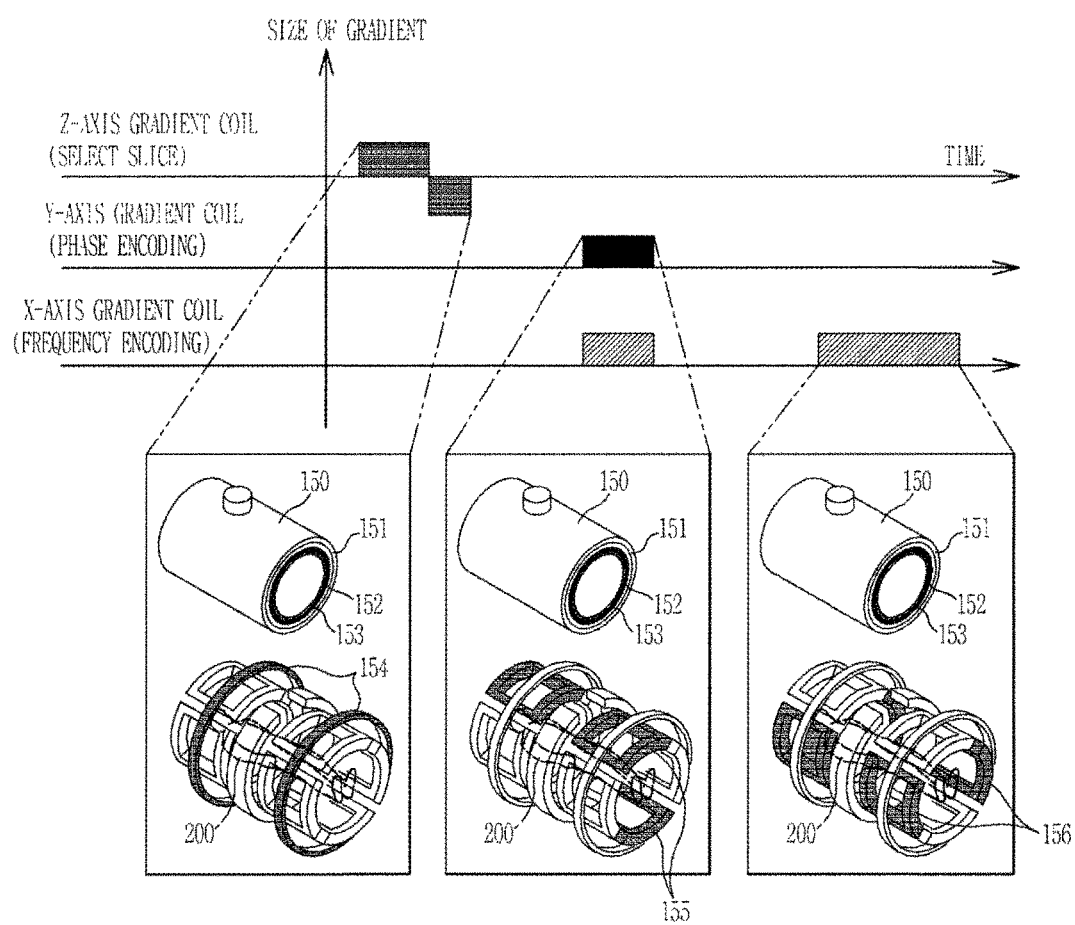
FIG. 5 is a drawing illustrating a graph of a gradient magnetic field strength and a pulse sequence related to the operation of a gradient coil.

FIG. 2 is an exterior perspective view showing the magnetic resonance imaging apparatus 100 in accordance with the exemplary embodiment of the present invention, FIG. 3 is a drawing of a space in the magnetic resonance imaging apparatus 100 shown in FIGS. 1-2, in which the subject 200 is placed, which has an x-axis, a y-axis, and a z-axis, FIG. 4 is a drawing illustrating a gradient coil unit in accordance with the exemplary embodiment of the present invention, and FIG. 5 is a drawing illustrating a graph of a gradient magnetic field strength from the gradient coil of the gradient coil unit 152 and a pulse sequence that is related to the operation of the gradient coil.

The operation of the magnetic resonance imaging apparatus 100 in accordance with the exemplary embodiment of the present invention will be described in more detail in conjunction with FIGS. 1 and 2.

The magnet assembly 150 is provided with a cylindrical shape having an empty interior space, and the interior space is referred to as a cavity unit or bore. A transfer unit 210, such as a movable table, is configured to move the subject 200 lying down on the transfer unit 210 into the cavity unit, so that a magnetic resonance signal may be obtained.

The magnet assembly 150 includes the static magnetic field coil unit 151, the gradient coil unit 152, and the RF coil unit 153.

The static magnetic field coil unit 151 may be provided to have a shape of the cavity unit, with the static magnetic field coil unit 151 being wound by coils, and when current is applied to the static magnetic field coil unit 151, a static magnetic field is formed inside the magnet assembly 150, that is, at the cavity unit.

The direction of a static magnetic field is generally in parallel to the longitudinal axis of the cavity unit or bore of the magnet assembly 150.

When a static magnetic field is formed at the cavity unit, the atomic nuclei of atoms constituting the subject 200, and in particular, the atomic nucleus of the hydrogen atom, is aligned in the direction of the static magnetic field, and performs a precession around the direction of the static magnetic field. The speed of the precession of an atom nucleus may be expressed by a precession frequency, referred to as the Larmor frequency which may be expressed by Equation (1) below:

$$\omega = \gamma B_0 \qquad (1)$$

Here, $\omega$ is the Larmor frequency, $\gamma$ is a proportional constant, and $B_0$ is the intensity of an outside magnetic field. The proportional constant $\gamma$ is varied according to the type of an atomic nucleus, the unit of the intensity of the outside magnetic field is Tesla (T) or Gauss (G), and the unit of the precession frequency is Hertz (Hz).

For example, the hydrogen proton is provided with the precession frequency of about 42.58 MHz inside a magnetic field of 1 T, and since the atom which has the largest proportion among all the atoms that compose a human body is hydrogen, in MRI, a magnetic resonance signal is mainly obtained by using the precession of the hydrogen proton.

The gradient coil unit 152 forms a gradient magnetic field by generating a gradient magnetic field at the static magnetic field formed at the cavity unit.

As illustrated in FIG. 3, the axis which is parallel to the longitudinal direction from the head and the feet of the subject 200, that is, the axis that is parallel to the direction of the static magnetic field, may set as the z-axis, the axis which is parallel to the left/right directions of the subject 200, may be set as the x-axis, and the axis which is parallel to the vertical direction of the lying-down subject 200 and/or the vertical direction of the space in the cavity unit or bore, may be set as the y-axis.

In order to obtain three-dimensional space information, the gradient magnetic field for each of the x-axis, the y-axis, and the z-axis is needed, and thus the gradient coil unit 152 includes three pairs of the gradient coils.

As illustrated in FIG. 4 and FIG. 5, z-axis gradient coils 154 are generally composed of a pair of ring-type coils, and y-axis gradient coils 155 are positioned at the top of the lying-down subject 200 and at the bottom of the lying-down subject 200, respectively. X-axis gradient coils 156 are positioned to the left of the subject 200 and to the right of the subject 200, respectively.

When direct current (DC) having different polarities flows toward opposite directions in the two z-axis gradient coils 154, respectively, a change in the magnetic field occurs in the z-axis direction, and thus a gradient magnetic field is formed. In FIG. 5, the forming of the z-axis gradient magnetic field, when the z-axis gradient coil 154 is used, is illustrated by a pulse sequence.

As the gradient magnetic field being formed in the z-axis direction is larger, a slice having a thin thickness thereof may be selected, and thus the z-axis gradient coil 154 is used for a selection of the slice.

When the slice is selected through the gradient magnetic field formed by the z-axis gradient coil 154, all the spins of atomic nuclei that compose the slice are provided with the same frequency and the same phase, and thus each spin may not be distinguished from each other At this time, when a gradient magnetic field is formed in the y-axis direction by the y-axis gradient coil 155, the gradient magnetic field generates a phase shift so that the lines of the slice may be provided with different phases from each other.

That is, when the y-axis gradient magnetic field is formed, the spins applied with a larger gradient magnetic field are changed into a phase having a higher frequency, and the spins applied with a smaller gradient magnetic field are changed to a phase having a lower frequency. When the y-axis gradient magnetic field is removed or not generated, a phase shift is generated at each line of the selected slice so that each line is provided with a different phase from each other, and through such phase shifts, each line may be distinguished. Accordingly, the gradient magnetic field formed by the y-axis gradient coil 155 is used for phase encoding. In FIG. 5, the forming of the y-axis gradient magnetic field, when the y-axis gradient coil 155 is used, is illustrated by a pulse sequence.

The slice is selected through the gradient magnetic field formed by the z-axis gradient coil 154, and the lines, which compose the selected slice, are distinguished based on phases that are different from each other through the gradient magnetic field formed by the y-axis gradient coil 155. However, each spin that composes the line of a selected slice is provided with the same frequency and the same phase, and thus each spin may not be distinguished.

At this time, when a gradient magnetic field is formed in the x-axis direction by the x-axis gradient coil 156, the gradient magnetic field enables the spins of the atomic nuclei, which compose each line, to be provided with different frequencies to each other, so that each spin may be distinguished from each other. Accordingly, the gradient magnetic field formed by the x-axis gradient coil 156 is used for frequency encoding.

As described above, the gradient magnetic field formed by the z-axis, the y-axis, and the x-axis perform a spatial encoding of the spatial position of each spin through the selecting of the slice, the encoding of the phase, and the encoding of the frequency, respectively.

The gradient coil unit 152 is connected to the gradient applying unit 130, and the gradient applying unit 130 is configured to apply a driving signal to the gradient coil unit 152 according to the control signal transmitted from the pulse sequence controlling unit 122 to generate a gradient magnetic field. The gradient applying unit 130 may be provided with three driving circuits corresponding to the three gradient coils 154, 155, and 156 that compose the gradient coil unit 152, to drive each respective gradient coil 154, 155, 156, respectively. As described above, the atomic nuclei aligned by the outside magnetic field perform precession at the Larmor frequency, and a vector sum of a magnetization of a plurality of atomic nuclei may be expressed as a single net magnetization M.

The component of the z-axis of the net magnetization M is difficult to be measured, and therefore only a magnetization $M_{xy}$ may be detected. Thus, in order to obtain a magnetic resonance signal, the net magnetization M is needed to be present in the XY plane through excitation of the atomic nuclei. For the excitation of an atomic nucleus, the RF pulse tuned at the Larmor frequency of the atomic nucleus is needed to be applied to the static magnetic field.

The RF coil unit 153 includes a transmission coil to transmit a RF pulse, and a reception coil to receive an electromagnetic wave, that is, a magnetic resonance signal, that is emitted by the excited atomic nucleus.

The RF coil unit 153 is connected to the RF applying unit 140, and the RF applying unit 140, according to the control signal transmitted from the pulse sequence controlling unit 122, applies a driving signal to the RF coil unit 153 to emit an RF pulse.

The RF applying unit 140 may include a modulating circuit configured to modulate a radio-frequency output signal into a pulse-type signal, and a RF power amplifier configured to amplify the pulse-type signal.

In addition, the RF coil unit 153 is connected to the image processing unit 160, and the image processing unit 160 includes a data collection unit 161 to receive the data with respect to the magnetic resonance signal that is generated from an atomic nucleus, and a data processing unit 163 to generate a magnetic resonance image by processing the data received from the data collection unit 161.

The data collection unit 161 includes a pre-amplifier configured to amplify the magnetic resonance signal that is received by the reception coil of the RF coil unit 153, a phase detection unit to detect a phase by receiving a magnetic resonance signal from the pre-amplifier, and an A/D converter to convert the analog signal acquired by the phase detection into the digital signal. The data collection unit 161 transmits the magnetic resonance signal, which is converted into the digital signal, to be stored in a data storage unit 162.

At the data storage unit 162, a data space that composes a two-dimensional Fourier space is formed, and when the storage of the entire data is completed after the entire data is completed by the MRI scanning, the data processing unit 163 converts the data in the two-dimensional Fourier space through the inverse two-dimensional Fourier transform, and recomposes the image with respect to the subject 200. The recomposed image may be displayed on the display 112, may be stored in the data storage unit 163 or other memory or storage devices, and/or may be transmitted externally to other devices, possibly remote storage devices, and/or display devices external to the magnetic resonance imaging apparatus 100; for example, through a communication interface and/or a network interface.

As the method of the present invention is mainly being used for obtaining a magnetic resonance signal from an atomic nucleus, a spin echo pulse sequence is included. When a RF pulse is applied at the RF coil unit 153, after a first application of the RF pulse is applied, if a RF pulse is applied for one more time while having a proper time interval $\Delta t$, for example, a predetermined time $\Delta t$, after the time interval $\Delta t$ has passed, a strong transverse magnetization occurs at the atomic nuclei, and from such, a magnetic resonance signal may be obtained. The above is referred to as the spin echo pulse sequence, and the time for the magnetic resonance signal to occur after the first RF pulse is applied is referred to as the Time Echo (TE). Another parameter TR, as used herein, is the repetition time, which is the amount of time between successive pulse sequences applied to the same slice.

The degree of the proton being flipped may be expressed by the angle moved from the axis where the proton was positioned before being flipped, and by the degree of the flip, and so the degree of the proton being flipped may be expressed as a 90° RF pulse or a 180° RF pulse.

In the exemplary embodiment of the present invention to be described hereinafter, the spin echo pulse sequence will be used. In addition, a first RF pulse will be set as the 90° RF pulse and a second RF pulse will be set as the 180° RF pulse, while, for the sake of convenience, the first RF pulse may be referred to herein as the first pulse and the second RF pulse may be referred to herein as the second pulse.

Figure 6:
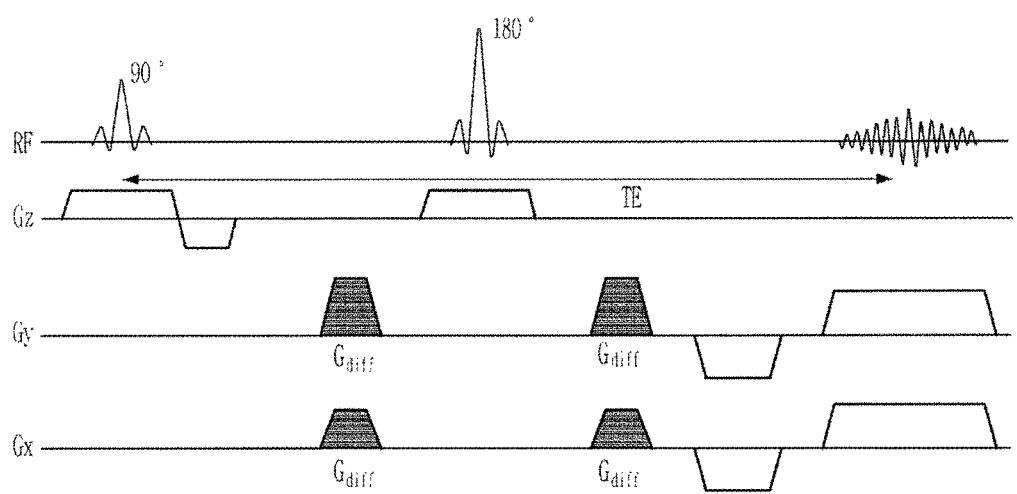
FIG. 6 is a drawing illustrating a pulse sequence configured to acquire a diffusion-weighted image in accordance with the exemplary embodiment of the present invention.
Figure 7A:
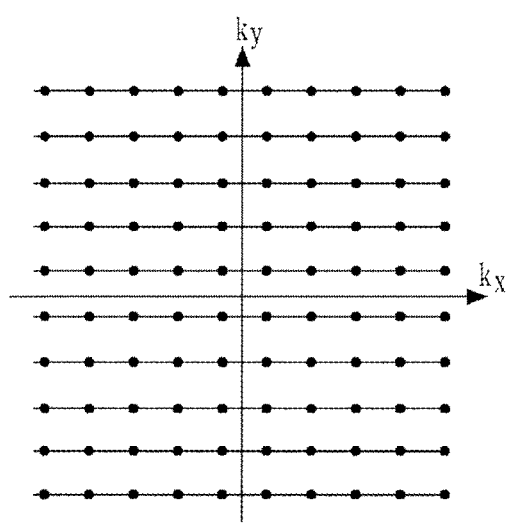
FIGS. 7A-7B are drawings illustrating a comparison of a radial k-space in accordance with the exemplary embodiment of the present invention with a rectangular coordinate k-space.
Figure 7B:
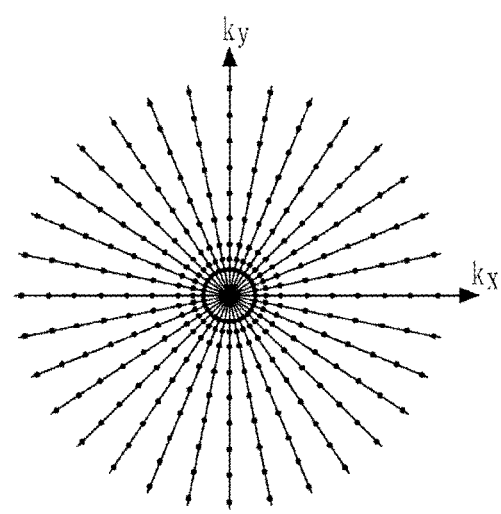
Figure 8:
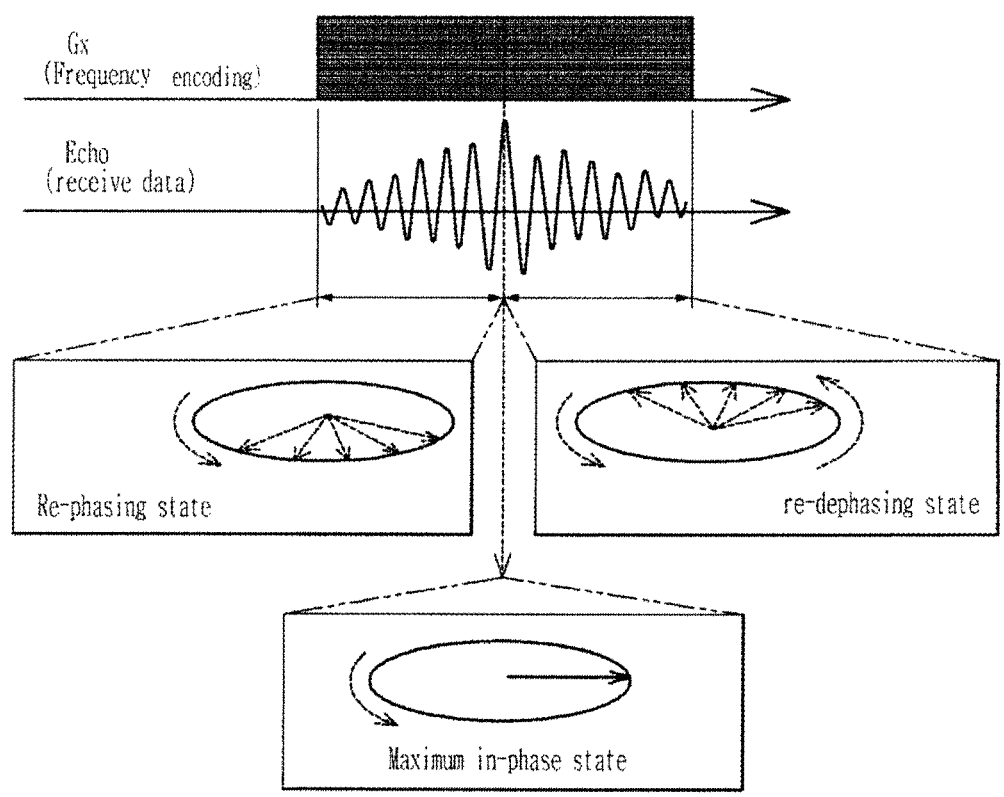
FIG. 8 is a drawing illustrating a dominant effect, through a frequency encoding process of an echo signal, which the data at a central portion of a k-space exerts on the contrast of an image.
Figure 9:
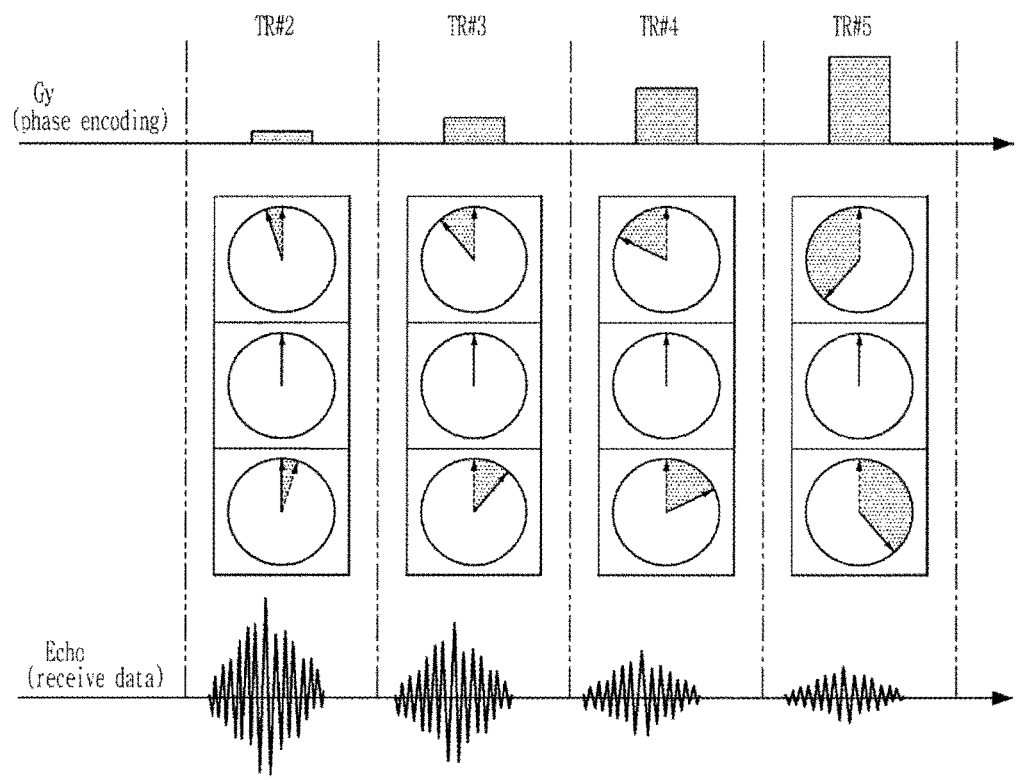
FIG. 9 is a drawing illustrating a dominant effect, through a phase encoding process of an echo signal, which the data at a central portion of a k-space exerts on the contrast of an image.

FIG. 6 is a drawing illustrating a pulse sequence configured to acquire a diffusion-weighted image in accordance with the exemplary embodiment of the present invention, FIGS. 7A-7B are drawings illustrating a comparison of a radial k-space in accordance with the exemplary embodiment of the present invention with a rectangular coordinate k-space, FIG. 8 is a drawing illustrating a dominant effect, through a frequency encoding process of an echo signal, which the data at a central portion of a k-space exerts on the contrast of an image, and FIG. 9 is a drawing illustrating a dominant effect, through a phase encoding process of an echo signal, which the data at a central portion of a k-space exerts on the contrast of an image.

A diffusion-weighted image is referred to as an image provided with the difference of the contrast weighted according to the degree and the direction of the diffusion of the molecules that are generated inside the tissue of the subject 200, such as a human body, by applying a diffusion gradient magnetic field from the gradient coil unit 152. The gradient coil unit 152 generates a diffusion gradient magnetic field oriented to have a longitudinal direction, for example, from the North polarity to the South polarity of the magnetic field. Accordingly, the longitudinal direction of the diffusion gradient magnetic field may be oriented at an angle to a predetermined axis or reference direction, such as the z-axis as shown in FIG. 2, which is parallel to the longitudinal axis of the cavity unit or bore. Accordingly, the term "angle", as used herein with reference to the magnetic fields and lines in k-space, indicates an angle measured with reference to a predetermined reference axis or direction.

In a single voxel, that is, a volumetric pixel or volume element, a large number of spins are present, and in the case of a material which is easily diffused when the phases of the spins are focused again by having the 180° RF pulse applied at the spin echo pulse sequence, the phases of the spins are incompletely focused, that is, the phases of the spins are dispersed, and thus a reduction of a signal occurs.

On the contrary, in the case of a material which is not easily diffused, the phases of the spins are focused and thus the reduction of a signal does not occur nearly as much when compared to the material which is easily diffused.

As illustrated in FIG. 6, when a pair of gradient magnetic fields having the same size and different directions, that is, a diffusion gradient magnetic field $G_{diff}$, with components of gradient fields indicated by $G_x$, $G_y$, and $G_z$ associated with each axis, is applied before and after the 180° RF pulse is applied at the spin echo pulse sequence, in the case of the material which is easily diffused, the degree of the phases of the spins being dispersed by the diffusion gradient magnetic fields becomes larger, and thus the reduction of a signal also becomes larger. In the case of a material which is not easily diffused, the phases of the spins are not changed at the diffusion gradient magnetic fields, and thus the reduction of a signal is does not occur nearly as much.

That is, when the diffusion gradient magnetic field is applied, the degree of the reduction of a signal increases between the material which is easily diffused and the material which is not easily diffused, and thus an image is obtained with an weighted contrast between the material which is easily diffused and the material which is not easily diffused.

The magnetic resonance signal that is reduced according to the degree of the diffusion may be defined by Equation (2):

$$SI = SI_0 * \exp(-b * \text{ADC}). \tag{2}$$

Here, $SI_0$ represents the intensity of the signal when the diffusion gradient magnetic field is not applied, and SI represents the intensity of the signal when the diffusion gradient magnetic field is applied. The parameter b is referred to as the b-value. The b-value may be a constant related to the amount of the applied diffusion gradient magnetic field, and/or the b-value may be an adjustable parameter.

The Apparent Diffusion Coefficient (ADC) in Equation (2) is a value that is used to quantify the degree of actual diffusion. When the b-value increases, a greater amount of the diffusion gradient magnetic field is applied, and thus even microscopic diffusion may also be detected.

To detect the diffusion of the microscopic spins, the amount of the diffusion gradient magnetic field must be increased. As the amount of the applied diffusion gradient magnetic field is proportional to the time and the size of the applied diffusion gradient magnetic field, in order for the large amount of the diffusion gradient magnetic field to be applied, the size of the gradient magnetic field must be increased, or the time in which the gradient magnetic field is applied must be increased.

In general, the increasing of the size of the gradient magnetic field is limited by the specific hardware and components of the magnetic resonance imaging apparatus 100 and by a constraint of eddy currents in the magnetic fields, and thus the time is adjusted in which the gradient magnetic field is applied.

However, if the time in which the gradient magnetic field is applied is increased, the TE is increased, and as the TE is increased, the TR is also increased, and therefore the time for acquiring an image is increased.

In addition, when the gradient magnetic field diffusion is applied, the magnetic resonance imaging apparatus becomes sensitive even to a small movement of the subject 200 or parts of the subject 200 such as the typical moving of internal organs such as the heart, and thus a motion artifact may occur in the MRI image of the subject 200.

In order to reduce the occurrence of any motion artifacts, and to reduce the time for acquiring an image, the magnetic resonance imaging apparatus 100 of the present invention obtains a diffusion-weighted image by forming the radial k-space by radial trajectory sampling.

In FIG. 7B the radial K-space defines a single plane, with the K-space having a plurality of sampling lines defining a diameter of a circle by radial sampling the echo signal in accordance with the exemplary embodiment of the present invention is illustrated, in comparison with a rectangular coordinate K-space shown in FIG. 7A.

The image processing unit 160 performs a radial trajectory sampling on an echo signal of the subject 200 after receiving the echo signal of the subject 200 from the RF coil unit 153, and as illustrated in FIG. 7B, forms the radial k-space having a plurality of radial sampling lines. In the exemplary embodiment of the present invention, the radial k-space is described as being formed through the radial trajectory sampling as one example, but alternatively a k-space may be formed through a spiral sampling.

In general, the data positioned at the central portion of the k-space is configured to determine the contrast of an image and the intensity of a signal.

That is, as illustrated in FIG. 8, in the case of the data positioned at a central portion of the k-space, unlike the surrounding portions, the phases of the spins are focused in the frequency encoding process while being in phase, and as illustrated in FIG. 9, a phase shift has not occurred in the phase encoding process or the degree of the phase shift is small. In FIG. 8, for frequency encoding, at the center or mid-point of the echo signal along the time axis, a maximum in-phase state occurs, while re-phasing states occur before the center of the echo signal, and re-dephasing states occur after the center of the echo signal. In FIG. 9, during phase encoding, various TR values are indicated by the designations TR#2, TR#3, TR#4, TR#5, etc. When the TR number is small, the acquired echo signal is positioned at the central portion of the k-space. Referring for example, to TR#2 in FIG. 9, the degree of the phase shift which has occurred is shown to be relatively small.

For the reasons described herein, when the image provided with a weighted contrast, such as a diffusion-weighted image, is being reconstructed in the prior art, in the case of the rectangular coordinate k-space illustrated in FIG. 7A, a particular sampling line that passes the central portion of the k-space exerts a dominant effect on an image reconstruction.

On the contrary, in the present invention, in the case of the radial k-space illustrated in FIG. 7B in accordance with the exemplary embodiment of the present invention, since all the sampling lines pass the central portion of the k-space, each sampling line exerts an effect on an image reconstruction with the same weighted value.

When obtaining the radial sampling line, the signal that is reduced by diffusion according to Equation (2) herein is obtained.

Thus, in the case of forming the sampling lines that compose the radial k-space, the control unit 120 applies the diffusion gradient magnetic field by controlling the gradient magnetic field coil unit 152 in a way that the direction of the diffusion gradient magnetic field is applied differently at each sampling line, so that when obtaining each sampling line, the signals may be obtained which are reduced by the diffusions of different directions. Thus, the image that is reconstructed as described above includes the diffusion information at several directions.

In more detail, when obtaining the number n of the sampling lines, as the diffusion gradient magnetic fields are applied in the same direction as the directions of the number n of the sampling lines, since the directions of the sampling lines are different from each other, the directions of the diffusion gradient magnetic fields being applied are all different from each other, and thus the diffusion-weighted image, which is the case with the number n of the diffusion directions that are different from each other, may be obtained. As illustrated in FIG. 7B, since the radial k-space is symmetrical about a $k_x$-axis, only the sampling lines having the radial directions from about zero degrees to about 180 degrees are used.

Figure 10:
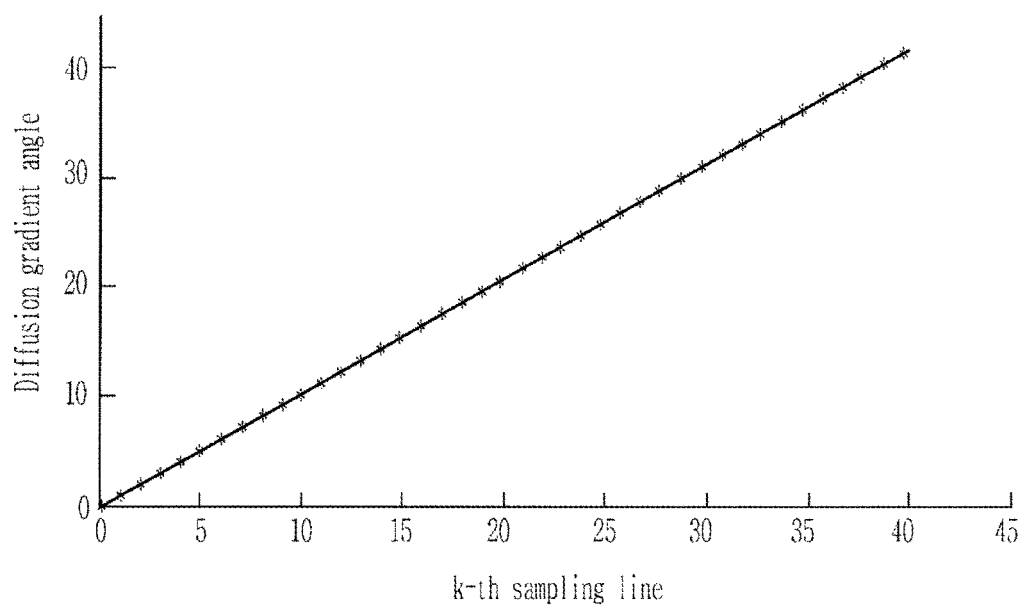
FIGS. 10 to 12 are graphs illustrating an angle of a diffusion gradient magnetic field that is changed according to a plurality of sampling lines that composes a radial k-space in accordance with the exemplary embodiment of the present invention.

FIG. 10 is a graph illustrating the angle of the diffusion gradient magnetic field that is changed according to the plurality of sampling lines that composes the radial k-space shown in FIG. 7B. As shown in FIG. 10, the angles of the diffusion gradient magnetic fields being applied at the sampling lines, that is, the directions of the diffusion gradient magnetic fields, are different from each other.

The method of the prior art has a single diffusion direction used with a single image by applying a diffusion gradient magnetic field in a single direction while obtaining the k-space. Compared to the method of the prior art, the method of the present invention uses multiple diffusion directions and so has a reduced time in acquiring an image.

Meanwhile, with respect to the diffusion model of an actual human body, such as the subject 200, the anisotropic degree thereof is not large, but when diffusion has occurred only in a single direction, as for a sampling line that is applied with a diffusion gradient magnetic field in the same direction as the diffusion direction or in the similar direction in the method of the present invention described herein, a signal that is reduced in intensity thereof by the diffusion is obtained, and as for a sampling line that is applied with a diffusion gradient magnetic field in the different direction from the direction of the diffusion, a signal that is not reduced in intensity thereof is obtained.

Thus, as a signal at a particular domain on a sinogram, which is a visual representation of the raw data obtained in imaging such as in computed axial tomography (CAT) scans, becomes smaller, while a signal at another particular domain does not become smaller.

With respect to the diffusion model of an actual human body, the anisotropic degree thereof is not large, and thus there is difficulty in imaging the human body in view of such diffusion, which is generated when the diffusion has occurred only in a single direction, but such difficulty does not largely influence the diffusion-weighted image that is obtained through the method of the present invention as described herein.

The diffusion-weighted image acquiring method in accordance with an alternative exemplary embodiment of the present invention is performed when forming the radial k-space, without applying the diffusion gradient magnetic field from the gradient coil unit 152 in the same direction as each radial sampling line, with the alternative exemplary embodiment applying the diffusion gradient magnetic fields in a way that the directions of the diffusion gradient magnetic fields, which are applied at two adjacent sampling lines, are crossed with each other.

In more detail, the control unit 120 applies the diffusion gradient magnetic fields by controlling the gradient coil unit 152, so that the directions of the diffusion gradient magnetic fields, which are being applied at the time of forming each sampling line that composes the radial k-line, are orthogonal to each other at two adjacent sampling lines.

Figure 11:
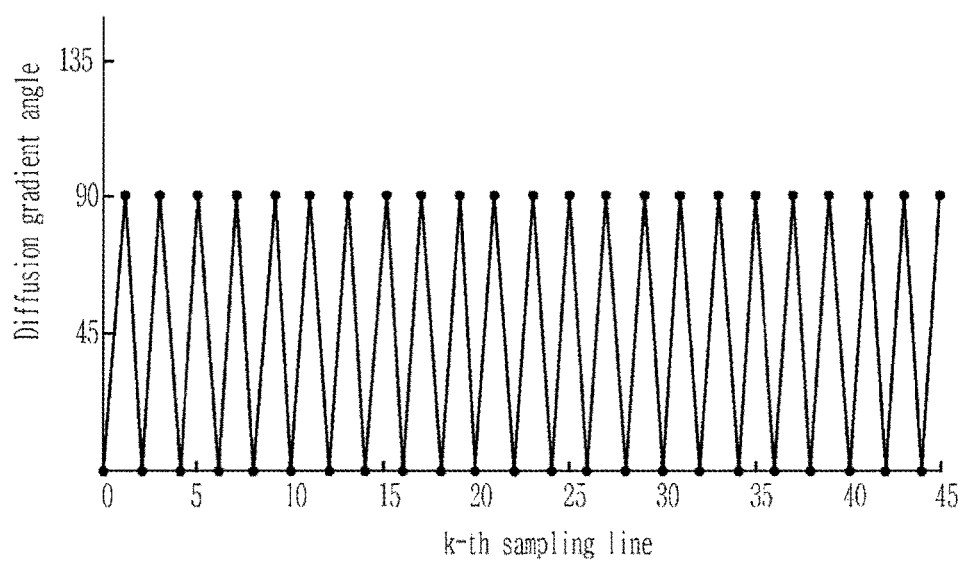

FIG. 11 is a graph illustrating the angle of the diffusion gradient magnetic field that is changed according to the sampling lines that compose the radial k-space, and as shown in the graph of FIG. 11, the difference of the angles at an even-numbered sampling line and at an odd-numbered sampling line is about 90 degrees.

When the directions of the diffusion gradient magnetic fields are orthogonal to each other at the adjacent sampling lines, even in a case of the diffusion occurring in a single direction, since the intensities of the signals on a sinogram repeatedly become larger and smaller, a difficulty occurs as the intensity of a signal at a particular domain becomes smaller while the intensity of a signal at another particular domain does not become smaller, but the difficulty may be resolved.

Here, FIG. 11 illustrates that the difference of the angles at an even-numbered sampling line and at an odd-numbered sampling line is about 90 degrees, but the difference of the angles is not limited hereto, and may be provided with the difference of the angles that is included in a predetermined range, which includes 90 degrees.

The diffusion-weighted image acquiring method in accordance with another alternative exemplary embodiment of the present invention, when forming the radial k-space, without applying the diffusion gradient magnetic fields in the same direction as each radial sampling line, allows the directions of the diffusion gradient magnetic fields, which are being applied at two adjacent sampling lines, to cross each other, while applying the diffusion gradient magnetic field at an angle that is determined according to Equation (3) below, with n and m being an index of a specific sampling line from among K sampling lines, with n, m, and K being integers:

$$\text{Angle}=(180 \text{ degrees}/K)*(n/2)$$

when n: even number, and K: number of sampling lines;

$$\text{Angle}=(180 \text{ degrees}/K)*((m-1)/2)+90 \text{ degrees} \quad (3)$$

when m: odd number, and K: number of sampling lines.

That is, the angles of the diffusion gradient magnetic fields being applied at the time of forming the even-numbered sampling lines are determined by the first part of Equation (3), and the angles of the diffusion gradient magnetic fields being applied at the time of forming the odd-numbered sampling lines are determined by the second part of Equation (3). For example, when the number of the sampling lines is 180, in a case of forming the second sampling line, the angle of the diffusion gradient magnetic field is about 1 degree, and in a case of forming the first sampling line, the angle of the diffusion gradient magnetic field being applied is about 90 degrees.

Figure 12:
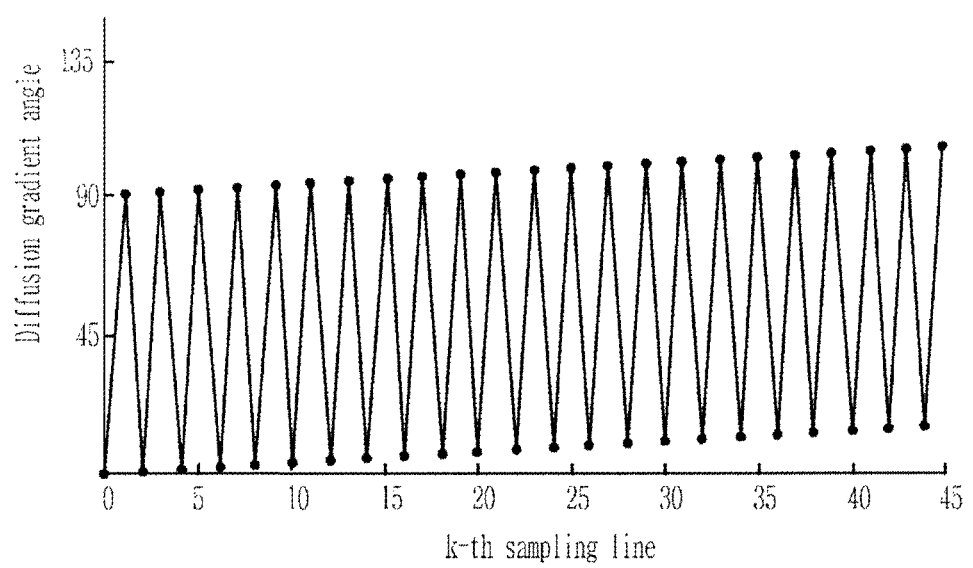

FIG. 12 is a graph illustrating the angle of the diffusion gradient magnetic field that is determined according to Equation (3), and by referring to the graph, the angle of the diffusion gradient magnetic field at the odd-numbered sampling line is larger by about 90 degrees than the angle of the diffusion gradient magnetic field at the immediately preceding even-numbered sampling line. Compared to the graph in FIG. 11, FIG. 12 illustrates that the angles of the diffusion gradient magnetic fields at the even-numbered sampling lines are not about zero degrees, but are increased by one degree.

Similar to the exemplary embodiment illustrated in FIG. 11, the directions of the diffusion gradient magnetic fields at the adjacent sampling lines are orthogonal to each other or close to being orthogonal to each other, and thus, even in the case that diffusion occurs in a single direction, since the intensities of the signals on a sinogram repeatedly becomes larger and smaller, the difficulty occurring as the intensity of a signal at a particular domain becomes smaller, while the intensity of a signal at another particular domain does not become smaller, may be resolved.

As in the exemplary embodiment illustrated in FIG. 10, since the directions of the diffusion gradient magnetic fields being applied at the sampling lines that compose the radial k-space are different from each other, the reconstructed image includes the diffusion information at several directions.

Thus, as in the exemplary embodiment illustrated in FIG. 10, the image acquiring time may be reduced, and as in the exemplary embodiment illustrated in FIG. 11, even in a case when the diffusion occurs in a single direction, since the intensities of the signals on a sinogram repeatedly become larger and smaller, the difficulty occurring as the intensity of the signal at a particular domain becomes smaller, while the intensity of the signal at another particular domain does not become smaller, may be resolved.

Figure 13:
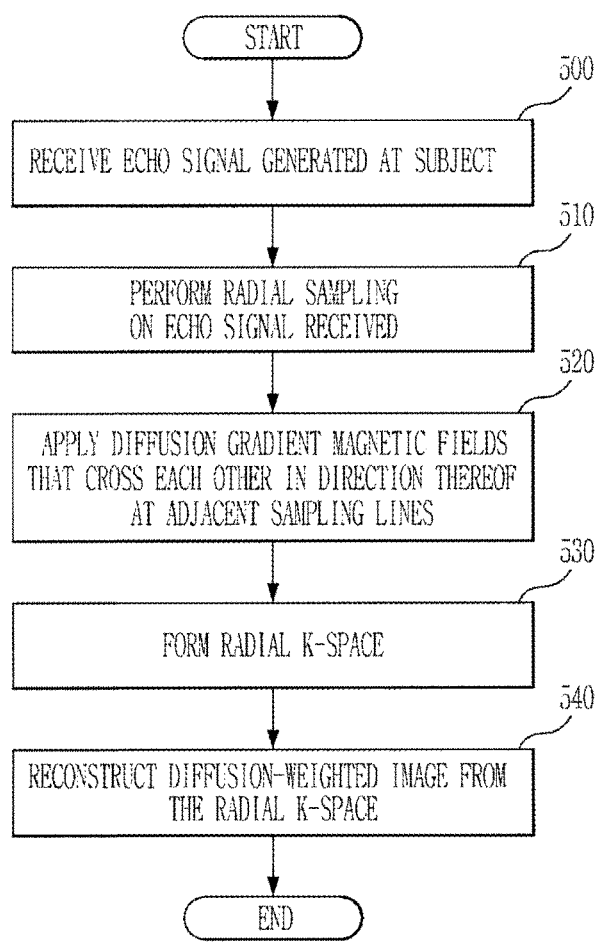
FIGS. 13 to 14 are flow charts illustrating diffusion-weighted image acquiring methods in accordance with the exemplary embodiment of the present invention.

FIG. 13 is a flow chart illustrating the diffusion-weighted image acquiring method of the magnetic resonance imaging apparatus in accordance with the exemplary embodiment of the present invention.

Referring to FIG. 13, the image processing unit 160 receives the echo signal being generated at the subject 200 from the RF coil unit 153 in step 600, and performs a radial trajectory sampling on the echo signal that is received in step 610.

The control unit 120, when forming the sampling lines which compose the radial k-space by radial-sampling the echo signal at the image processing unit 160, applies the diffusion gradient magnetic fields by controlling the gradient coil unit 152 so that the directions of the diffusion gradient magnetic fields are different from each other at the respective sampling lines in step 620.

As described above, when the diffusion gradient magnetic fields are applied so that the directions of the diffusion gradient magnetic fields being applied at the sampling lines are different from each other, the signal, which is reduced by the diffusion of the sampling line at a different direction, may be obtained when each sampling line is obtained, and thus the image that is reconstructed as describes above includes the diffusion information at several directions.

In more detail, when obtaining the number n of the sampling lines, as the diffusion gradient magnetic fields are applied in the same direction as the directions of the number n of the sampling lines, since the directions of the sampling lines are different from each other, the directions of the diffusion gradient magnetic fields being applied are all different from each other, and thus the diffusion-weighted image, which is the case with the different number n of the diffusion directions, may be obtained.

When forming each sampling line by performing a radial trajectory sampling on the echo signal, the radial k-space is formed by applying the diffusion gradient magnetic fields in a way that the directions of the diffusion gradient magnetic fields are different from each other at the sampling lines in step 630.

When the radial k-space is formed, the image processing unit 160 reconstructs the diffusion-weighted image from the radial k-space in step 640. In the reconstruction of the diffusion-weighted image, a Filtered Back Projection (FBP) method in the prior art may be applied.

Figure 14:
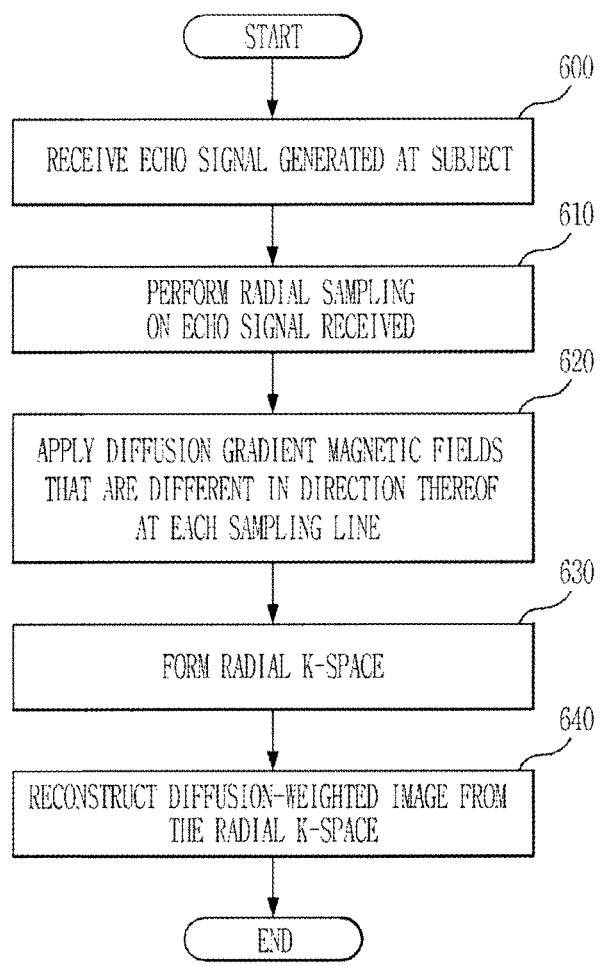

FIG. 14 is a flow chart illustrating the diffusion-weighted image acquiring method of the magnetic resonance imaging apparatus in accordance with the alternative exemplary embodiment of the present invention.

Referring to FIG. 14, the image processing unit 160 receives the echo signal being generated at the subject 200 from the RF coil unit 153 in step 500, and performs a radial trajectory sampling on the echo signal that is received in step 510.

The control unit 120, when forming the sampling lines which compose the radial k-space by radial-sampling the echo signal at the image processing unit 160, applies the diffusion gradient magnetic fields by controlling the gradient coil unit 152 so that the directions of the diffusion gradient magnetic fields cross each other at two adjacent sampling lines in step 520.

The control unit 120, when forming the sampling lines that compose the radial k-space, is configured in a way that the directions of the diffusion gradient magnetic fields applied at the two adjacent sampling lines are crossed with each other, and applies the diffusion gradient magnetic fields by controlling the gradient coil unit 152 so that the diffusion gradient magnetic fields are applied at the angles that are determined by Equation (3).

Referring again to FIG. 14, when forming each sampling line by performing a radial trajectory sampling on the echo signal, the radial k-space is formed by applying the diffusion gradient magnetic fields in a way that the directions of the diffusion gradient magnetic fields applied to the sampling lines cross each other in step 530.

When the radial k-space is formed, the image processing unit 160 reconstructs the diffusion-weighted image from the radial k-space in step 540. In the reconstruction of the diffusion-weighted image, a Filtered Back Projection (FBP) method in the prior art may be applied.

In addition, using the present invention, an Apparent Diffusion Coefficient (ADC) map may be calculated in a faster and precise manner.

The above-described apparatus and methods according to the present invention can be implemented in hardware or firmware, or as software or computer code, or combinations thereof. In addition, the software or computer code can also be stored in a non-transitory recording medium such as a CD ROM, a RAM, a ROM whether erasable or rewritable or not, a floppy disk, CDs, DVDs, memory chips, a hard disk, a magnetic storage media, an optical recording media, or a magneto-optical disk or computer code downloaded over a network originally stored on a remote recording medium, a computer readable recording medium, or a non-transitory machine readable medium and to be stored on a local recording medium, so that the methods described herein can be rendered in such software, computer code, software modules, software objects, instructions, applications, applets, apps, etc. that is stored on the recording medium using a general purpose computer, a digital computer, or a special processor or in programmable or dedicated hardware, such as an ASIC or FPGA. As would be understood in the art, the computer, the processor, microprocessor controller or the programmable hardware include volatile and/or non-volatile storage and memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, the program may be electronically transferred through any medium such as communication signals transmitted by wire/wireless connections, and their equivalents. The programs and computer readable recording medium can also be distributed in network-coupled computer systems so that the computer readable code is stored and executed in a distributed fashion.

Although a few detailed exemplary embodiments of the present invention have been shown and described, it would be appreciated by those skilled in the art that changes may be made in these exemplary embodiments without departing from the principles and spirit of the present invention, the scope of which is defined in the claims and their equivalents.

What is claimed is:

1. A method of acquiring a diffusion-weighted image of a subject using a magnetic resonance imaging apparatus by applying diffusion gradient magnetic fields to the subject, the method comprising:

applying the diffusion gradient magnetic fields and a radio frequency (RF) signal to the subject;

receiving an echo signal generated from the subject;

continuously forming a radial k-space defining a single plane, the k-space having a plurality of sampling lines defining a diameter of a circle by radial sampling the echo signal that is received; and generating and displaying the diffusion-weighted image using the k-space;

wherein the diffusion gradient magnetic fields, which are applied at a time of forming of the sampling lines that compose the k-space, have different directions thereof from one another, and wherein the diffusion gradient magnetic fields applied at the time of forming the plurality of sampling lines that compose the k-space are applied to have a difference of angles at an even-numbered sampling line and an odd-numbered sampling line of the plurality of sampling lines, with the difference in the angles being 90 degrees.

2. The method of claim 1, wherein:
the angle of a diffusion gradient magnetic field applied at the time of forming the even-numbered sampling line is zero degrees, and an angle of a diffusion gradient magnetic field applied at the time of forming the odd-numbered sampling line is 90 degrees.

3. The method of claim 1, wherein:
the diffusion gradient magnetic fields applied at the time of forming the plurality of sampling lines that compose the k-space are applied such that an angle of a diffusion gradient magnetic field at an odd-numbered sampling line is greater by 90 degrees than an angle of a diffusion gradient magnetic field at an immediately preceding even-numbered sample line.

4. The method of claim 3, wherein:
an angle of a diffusion gradient magnetic field applied at the time of forming an even-numbered sampling line is increased in comparison to an angle of a diffusion gradient magnetic field applied at the time of forming a preceding even-number sampling line.

5. The method of claim 1, further comprising:
reconstructing a diffusion-weighted image from data of the k-space by using a Filtered Back Projection (FBP) method when the k-space is formed.

6. A magnetic resonance imaging apparatus, comprising:
a static magnetic field coil unit configured to apply a static magnetic field to a subject;
a gradient coil unit forming diffusion gradient magnetic fields at the static magnetic field;
a RF coil reception unit configured to apply a RF pulse to the subject, and to receive an echo signal generated from the subject;
an image processing unit continuously forming a radial k-space defining a single plane, the k-space having a plurality of sampling lines defining a diameter of a circle by radial sampling the echo signal of the subject received from the RF coil reception unit, and for generating a diffusion-weighted image using the k-space;
a display for displaying the diffusion-weighted image; and
a control unit configured to control the gradient coil unit so that directions of the diffusion gradient magnetic fields, which are applied at a time of forming each sampling line that composes the k-space, are different from each other, and wherein the diffusion gradient magnetic fields applied at a time of forming the plurality of sampling lines that compose the k-space are applied to have a difference of angles at an even-numbered sampling line and an odd-numbered sampling line of the plurality of sampling lines, with the difference in the angles being 90 degrees.

7. The magnetic resonance imaging apparatus of claim 6, wherein:
the control unit controls the gradient coil unit, so that an angle of a diffusion gradient magnetic field, which is being applied at the time of forming an even-numbered sampling line, is zero degrees, and that an angle of a diffusion gradient magnetic field, which is being applied at the time of forming an odd-numbered sampling line, is 90 degrees.

8. The magnetic resonance imaging apparatus of claim 6, wherein:
the control unit controls the gradient coil unit, so that an angle of a diffusion gradient magnetic field, which is being applied at the time of forming an odd-numbered sampling line, among the diffusion gradient magnetic fields applied at the time of forming the plurality of sampling lines that compose the k-space, is increased by 90 degrees in comparison to an angle of a diffusion gradient magnetic field at an immediately preceding even-numbered sampling line.

9. The magnetic resonance imaging apparatus of claim 8, wherein:
the control unit controls the gradient coil unit, so that an angle of a diffusion gradient magnetic field, which is being applied at the time of forming an even-numbered sampling line, is increased in comparison to an angle of a diffusion gradient magnetic field, which is being applied at the time of forming an immediately preceding even-numbered sampling line.

10. The magnetic resonance imaging apparatus of claim 6, wherein:
the image processing unit which, when the k-space is formed, reconstructs a diffusion-weighted image from data at the k-space by using a Filtered Back Projection (FBP) method.

* * * * *